US009383413B2

(12) United States Patent
Concepcion

(10) Patent No.: US 9,383,413 B2
(45) Date of Patent: Jul. 5, 2016

(54) METHOD OF PROCESSING RECURRENT SURGE OSCILLOGRAPH DATA TO ENABLE MORE PRECISE LOCATION OF GENERATOR ROTOR INTER-TURN SHORTS AND GROUND FAULTS

(71) Applicant: Allan G. Concepcion, Furlong, PA (US)

(72) Inventor: Allan G. Concepcion, Furlong, PA (US)

(73) Assignee: Siemens Demag Delaval Turbomachinery, Inc., Trenton, NJ (US)

( * ) Notice: Subject to any disclaimer, the term of this patent is extended or adjusted under 35 U.S.C. 154(b) by 294 days.

(21) Appl. No.: 14/077,632

(22) Filed: Nov. 12, 2013

(65) Prior Publication Data

US 2015/0130503 A1   May 14, 2015

(51) Int. Cl.
*G01R 31/34* (2006.01)
*G01R 31/02* (2006.01)

(52) U.S. Cl.
CPC ............ *G01R 31/343* (2013.01); *G01R 31/346* (2013.01); *G01R 31/025* (2013.01)

(58) Field of Classification Search
CPC .. G01R 31/343; G01R 31/346; G01R 31/025; G01R 31/10; G01R 31/11
USPC ............. 324/545–547, 765.01, 762.01–762.1
See application file for complete search history.

(56) References Cited

U.S. PATENT DOCUMENTS

| 4,785,233 A * | 11/1988 | Coleman ................ G01R 29/20 324/605 |
| 2015/0091606 A1* | 4/2015 | Ge ........................ G01R 35/00 324/765.01 |

OTHER PUBLICATIONS

Albright, Interturn Short-Circuit Detector for Turbine-Generator Rotor Windings, Jul. 1970, Steam Turbine-Generator Products Divisio: General Electric Company.*
Hindmarch et al,, Developments in Detecting Interturn Shorts in Generator Rotors Using the RSO Technique, NEI Parsons Ltd., 5th International Conference on Dielectric Materials, Measurements and Applications. 1988.*
Joksimovic et al,, The Detection of Inter-Turn Short Circuits in the Stator Windings of Operating Motors, IEEE Transactions on Industrial Electronics, Nov. 2000.*
Ramirez-Nino et al,, A Mathematical Method for Improving the Detecting of Interturn Short Circuits in Rotor Windings of Power Generators, Institute of Physics Publishing: Measurement Science and Technology. Nov. 2000.*
Smith, Monitoring for Rotor Shorted Turns, Siemens Power Generation Limted, 2015 (See Figures attached separately as Technical Paper and Technical Figures).*
MRTG Power Diagnostic Tests Pvt, Ltd., Recurrent Surge Oscillograph, 2013 MRTG Power Diagnostic Tests Pvt, Ltd.*

(Continued)

*Primary Examiner* — Patrick Assouad
*Assistant Examiner* — Sean Curtis

(57) ABSTRACT

A system and method for locating inter-turn short circuits or ground faults in a rotor winding of an electrical generator. The method analyzes data from a Recurrent Surge Oscillograph (RSO) test, identifies a spike or anomaly in a reflected RSO signal, determines an elapsed time between a transmitted signal and the anomaly in the reflected signal, calculates a distance along the winding conductor to the inter-turn short circuit or ground fault based on the elapsed time, and uses a geometric model of the winding conductor to identify a location of the fault based on the distance. The location of the inter-turn short circuit or ground fault specifies a coil number, a turn number within the coil and a position within the turn.

18 Claims, 6 Drawing Sheets

(56) References Cited

OTHER PUBLICATIONS

Powertest Asia Pvt, Ltd., RSO Test, 2009 Powertest Asia Pvt., Ltd.*

Maughan et al,, Utilization of Repetitive Surge Oscillograph (RSO) in the Detection of Rotor Shorted-Turns in Large Turbine-Driven Generators, 2011 Electrical Insulation Conference, IEEE.*

Rowtest Ltd., Testing Generator Rotor Windings Using the RSO Test Method, Process Tomography Limited, Jun. 2013.*

Infolytica, Accurately modeling the skewed rotor of an Induction Motor, www.infolytica.com/applications/ex0053/, Wayback Machine date of 2012, Infolytica Corporation.*

"Rotor Reflectometer" Type TDR100 and TDR100RB, Instruction Manual, 37 pages, issue 7, Aug. 2012, published by Process Tomographty Ltd. Wilmslow, Cheshire, UK.

Kerszenbaum, Isidor "Izzy", "Utilization of Repetitive Surge Oscillograph (RSO) in the Detection of Rotor Shorted-Turns in Large Turbine-Driven Generators", EIC Conference, Jun. 2011, 27 pages.

Siemens, "Recurrent Surge Oscillation Testing for Detecting Turbine Generator Rotor Electrical Faults" Document No. M05 FIP-408, Issued Sep. 2011, pp. 1-17, Siemens, Orlando Florida.

Kerszenbaum, Isidor, "Utilization of Repetitive Surge Oscillograph (RSO) in the Detection of Rotor Shorted-Turns in Large Turbine-Driven Generators" submitted to the 2011 IEEE Insulation Conference, 4 pages.

Sumatron, Inc. "Generator Rotor Shorted Turn Analyzer" Instruction Manual, for Turbo-Generator DC-Field Windings, Version 1.2, Sep. 2010, 16 pages.

InuoSys, "Rotor Tester" Model Inuo-Rotor, InuoSys Solutions Pte, Ltd. Singaport, 15 pages.

* cited by examiner

METHOD OF PROCESSING RECURRENT SURGE OSCILLOGRAPH DATA TO ENABLE MORE PRECISE LOCATION OF GENERATOR ROTOR INTER-TURN SHORTS AND GROUND FAULTS

BACKGROUND OF THE INVENTION

1. Field of the Invention

This invention relates generally to locating electrical short-circuits and ground faults in a rotor winding of an electrical generator and, more particularly, to a method for locating inter-turn shorts or ground faults in the rotor winding which analyzes data from a Recurrent Surge Oscillograph (RSO), identifies a spike or anomaly in a reflected RSO signal, determines an elapsed time between a transmitted signal and the anomaly in the reflected signal, and calculates a location of the inter-turn short or ground fault based on the elapsed time.

2. Description of the Related Art

Electrical generators of the type used by utilities to generate electricity are large and complex machines. Although the reliability and efficiency of these machines has improved over the years, there are still some generator maintenance issues which require regular monitoring. Among the most prominent maintenance issues with electrical generators are inter-turn short circuits and ground faults in the rotor winding.

Most electrical machines include a rotor with a copper winding. In the case of a large electrical generator, the rotor winding is constructed of heavy-gauge copper bar, rectangular in cross-section, which is formed in the shape of multiple coils. Each of the several coils contains several layers or "turns" stacked on top of one another, with an insulating material between the turns. The rotor winding is subjected to a variety of loads and stresses—including centrifugal forces, thermal expansion/contraction, and vibration—which can lead to deterioration and breakdown of the insulation. When the insulation breaks down, a short circuit between adjacent turns of the winding, or inter-turn short circuit, results. In other circumstances, rotor windings can develop a short circuit to ground, or ground fault.

Various methods have been developed to diagnose inter-turn short circuits and ground faults in generator rotor windings. One of the most flexible and widely-used diagnostic tools for rotor winding faults is the Recurrent Surge Oscillograph (RSO) test. The RSO test can be used with the rotor in position in the generator frame, thereby eliminating costly disassembly of the generator. The RSO test can also be used with the rotor spinning, and can therefore detect inter-turn short circuits and ground faults which only appear when the winding is subjected to centrifugal force. In the RSO test, a high-frequency, low-voltage waveform is inserted at both ends of the winding, and the differences in the returning signals are evaluated.

An experienced technician can identify one or more inter-turn short circuits or ground faults by examining the RSO test output. The technician may even be able to estimate which coil of a winding has the inter-turn short circuit or the ground fault. However, even for an experienced RSO test technician, the waveforms produced as RSO test output do not provide sufficient resolution to accurately determine the location of the inter-turn short circuit or ground fault in the rotor winding. A method of rotor winding fault diagnosis is needed which does not require an experienced technician to evaluate the results, and which enables the location of the fault to be defined—including not only the coil number, but also the turn within the coil and the position within the turn.

SUMMARY OF THE INVENTION

In accordance with the teachings of the present invention, a method is disclosed for locating inter-turn short circuits or ground faults in a rotor winding of an electrical generator. The method analyzes data from a Recurrent Surge Oscillograph (RSO) test, identifies a spike or anomaly in a reflected RSO signal, determines an elapsed time between a transmitted signal and the anomaly in the reflected signal, calculates a distance along the winding conductor to the inter-turn short circuit or ground fault based on the elapsed time, and uses a geometric model of the winding conductor to identify a location of the fault based on the distance. The location of the inter-turn short circuit or ground fault specifies a coil number, a turn number within the coil and a position within the turn.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a system and method for locating faults in a generator rotor winding is merely exemplary in nature, and is in no way intended to limit the invention or its applications or uses. For example, the invention described below has particular application for locating faults in rotor windings of large electrical generators. However, the invention may also have application to fault location in any motor or generator with a continuous winding.

Electrical generators of the type used to generate electricity for utilities are large, complex machines. In order to minimize downtime and expensive repairs, it is important to regularly test the generators for early indications of any problems which might occur. Inter-turn short circuits and ground faults are common problems in the rotor windings of these generators, due to the high centrifugal forces and vibrations associated with the rotor's spinning. Left uncorrected, inter-turn shorts and ground faults can degrade performance and cause significant damage to the generator.

Figure 1:
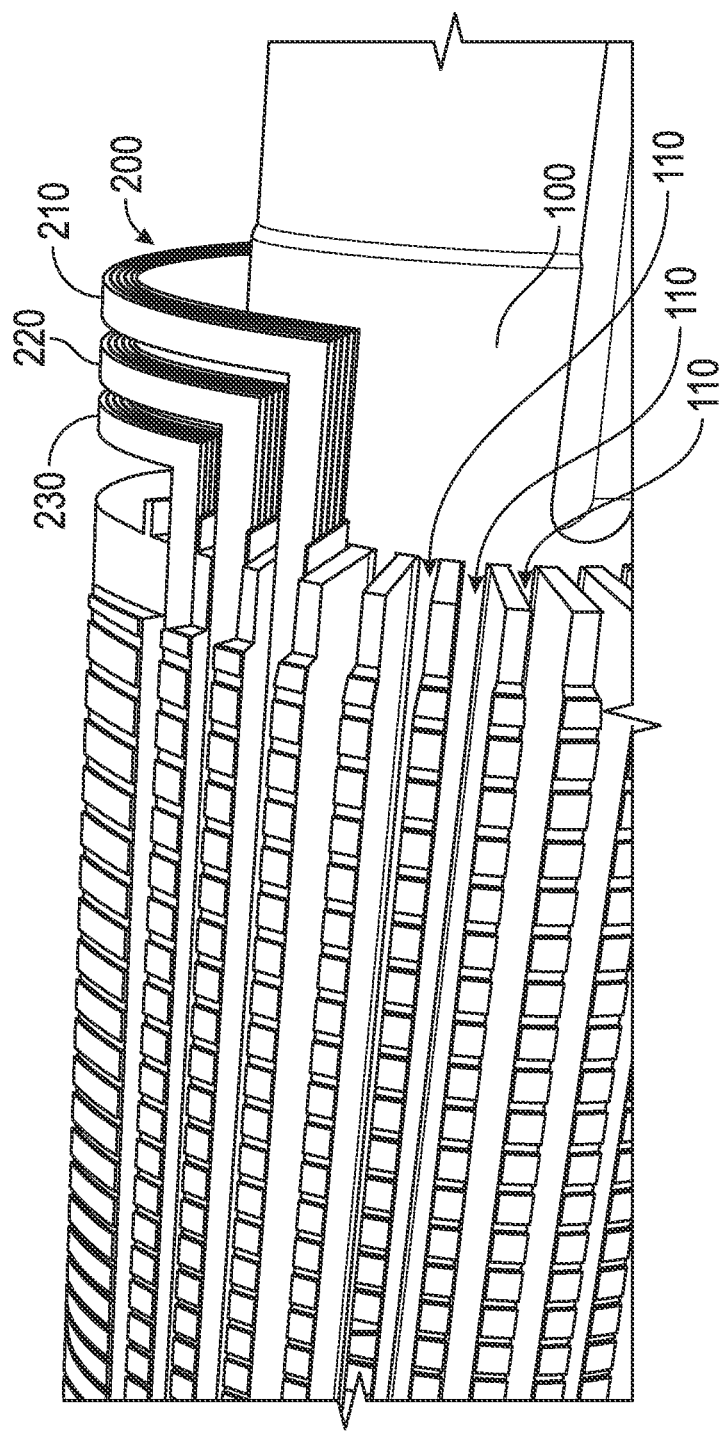
FIG. 1 is an illustration of a rotor and winding for an electrical generator which shows how coils are arranged on a rotor core.

FIG. 1 is an illustration of a rotor and winding for an electrical generator which shows how winding coils are arranged on a rotor core. A rotor core 100 includes slots 110. The rotor core is typically coupled at one end to a turbine (such as a steam turbine or a gas turbine) which provides the rotational energy to drive the rotor. A rotor winding 200 is arranged in the slots 110, such that the winding 200 defines a plurality of coils 210, 220, 230. A typical large electrical generator may have six to eight coils (only three of which are shown in FIG. 1) per pole, and two or four poles, as will be discussed below. Thus, when fully assembled, the rotor core 100 would have other coils (not shown in FIG. 1) in the remainder of the slots 110. The winding 200 is comprised of a single, continuous copper conductor 202, as would be understood by one skilled in the art, and as will be seen in FIG. 3 and later figures.

Figure 2:
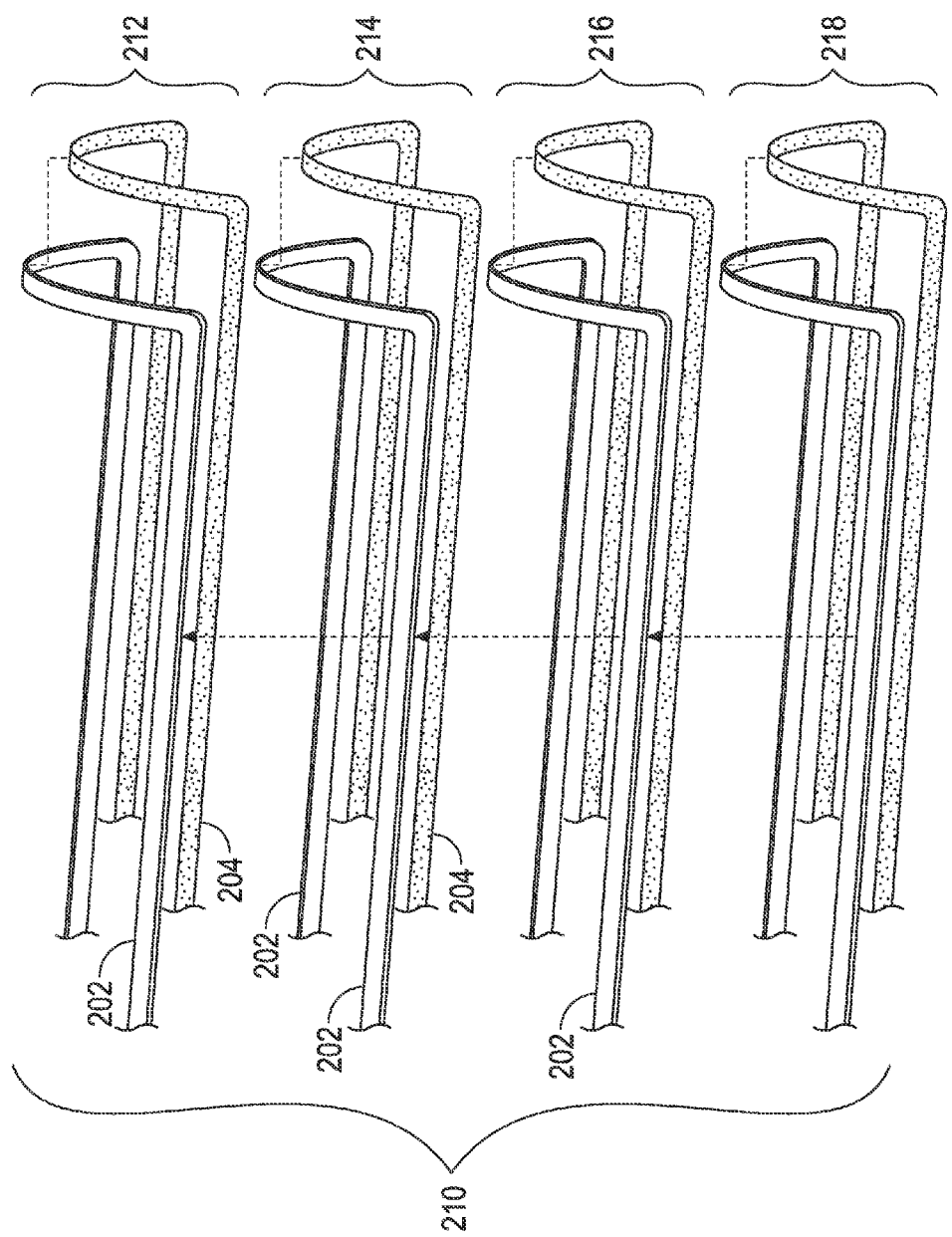
FIG. 2 is an illustration of the rotor winding which shows how one coil is layered in multiple turns of a copper conductor with insulation between the turns.

FIG. 2 is an illustration of the rotor winding 200 which shows how the coil 210 is formed by the conductor 202 layered in multiple turns (212-218), with insulation 204 between the turns. The conductor 202 is typically rectangular in cross-section, with a width of an inch or more and a thickness up to about one-half inch. Of course, these dimensions vary for different makes and models of generators. The insulation 204 is much thinner than the conductor 202, with a typical thickness of the insulation 204 being 10-15 thousandths of an inch. The insulation 204 is designed to prevent contact between adjacent layers or turns of the winding, so that the winding current flows continuously from one end of the conductor 202 to the other end. The insulation 204 is typically made of Nomex® paper or resin/epoxy-impregnated glass laminate material. Any breakdown of the insulation 204 is undesirable, as this can result in an inter-turn short circuit.

Figure 3:
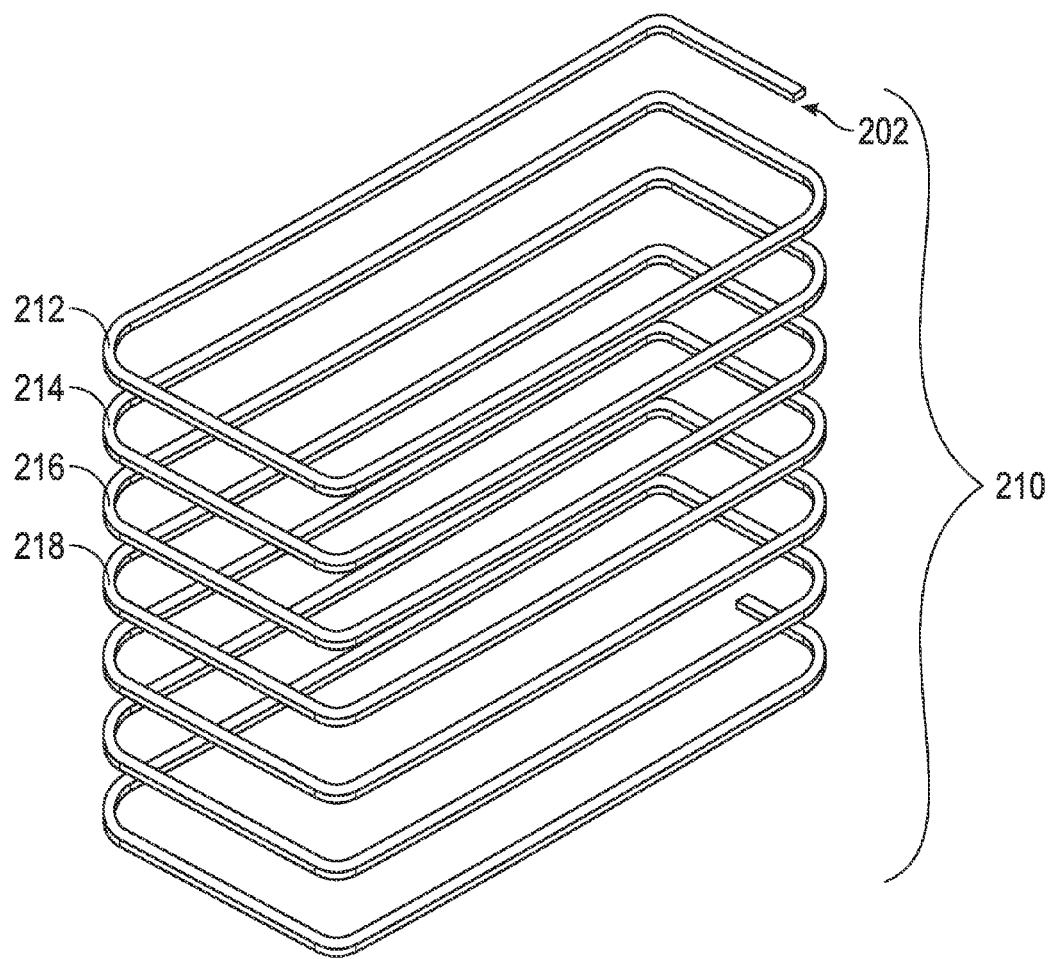
FIG. 3 is a schematic diagram of a winding coil which shows how the multiple turns are composed of a single copper conductor.

FIG. 3 is a schematic diagram of a winding coil, such as the coil 210, which shows how the multiple turns (212-218, etc.) are formed by the conductor 202. The coil 210 is shown flattened in this conceptual diagram (not in its true geometric shape, which is cylindrical to match the rotor core 100). In this figure, the coil 210 is shown as having seven turns. In large generators, each coil typically includes 6-10 turns, while smaller generators using smaller gauge conductor may have up to 30 turns per coil.

Figure 4:
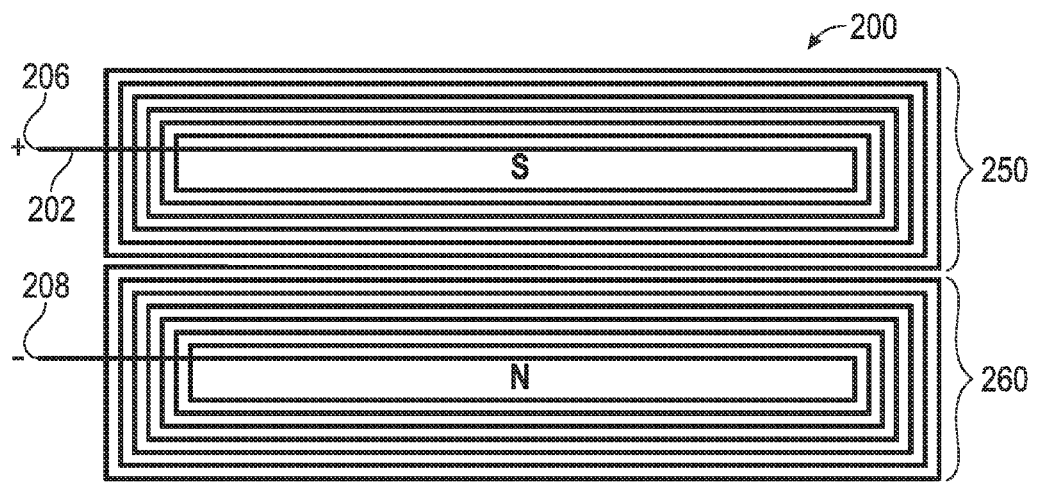
FIG. 4 is a schematic diagram of the rotor winding for a 2-pole electrical generator.

FIG. 4 is a schematic diagram of the rotor winding 200 for a 2-pole electrical generator. FIG. 4 shows how the conductor 202 runs in a continuous fashion through the entirety of the winding 200. Beginning at a first terminal 206, the conductor 202 traces the coils of a first pole 250, where each of the coils includes several turns as shown in FIGS. 2 and 3. The conductor 202 first forms the inner-most coil of the first pole 250, and continues outward. After forming the outer-most coil of the first pole 250, the conductor 202 crosses over to a second pole 260 where it first forms the outer-most coil. The conductor 202 continues to loop inward until all of the coils of the second pole 260 have been formed, at which point the conductor 202 exits the winding 200 and ends at a second terminal 208. Some generators are 4-pole designs, with each of the four poles occupying one-quarter of the circumference of the rotor, in which case the winding arrangement described above is repeated.

Many factors may lead to breakdown of the insulation 204. These factors include quality problems during manufacturing of the generator, such as copper chips which may become embedded in the insulation 204, as well as wear induced by ongoing operation of the generator. The rotor winding environment is characterized by strong mechanical pressure due to centrifugal loads, tearing forces due to unequal elongation between the conductor 202 and the insulation 204, and tearing forces due to relative movement during acceleration, deceleration, heating and cooling. Vibration of the spinning rotor also contributes to wear. Inter-turn voltages are not particularly high (on the order of several volts), but these voltages are sufficient to cause inter-turn short circuits in any area where the insulation 204 is breached due to the factors listed above.

Inter-turn short circuits may reduce generator performance, but are sometimes most noticeable by increased vibrations in the generator. The vibrations may be due to thermal asymmetry and/or magnetic asymmetry caused by irregular flow of the rotor winding current. In some cases, although they may lead to significant damage to the generator over time, inter-turn short circuits don't immediately cause any obvious performance changes, and can only be found by monitoring or testing. One test which is commonly used to detect inter-turn short circuits is the Recurrent Surge Oscillograph (RSO) test.

The RSO test is a testing technique used to detect shorted turns by inserting a high-frequency, low-voltage waveform at both ends of the winding 200, and evaluating the differences in the returning signals. The RSO test can be used with the rotor inside or outside the stator, and it can be used while technicians are working on the rotor due to the low voltages involved. The RSO test is also safe to the inter-turn insulation 204, as the low voltage of the test is not sufficient to break down the insulation 204.

Although the RSO test cannot be performed with the generator in operation (producing electricity), a key feature of the RSO test is that it can be run with the rotor spinning, so as to detect inter-turn short circuits which only appear under mechanical load—that is, when the turns of the coils are compressed together by the centrifugal forces of the spinning rotor. Thus, the RSO test can be run during acceleration or deceleration of the rotor, at full speed, or at standstill. Static rotor RSO testing is typically done with the rotor at several different angular positions, to detect inter-turn short circuits which may only appear under certain gravitational loading conditions.

Ground faults are another type of fault which may occur in generator rotors. As would be commonly understood, a ground fault is where the winding 200 makes electrical contact with a grounded element of the generator, such as the rotor core 100. Ground faults can occur when there is a breakdown of insulation or physical spacing between the winding and a grounded element. Ground faults, which can cause significant performance degradation of a generator, can also be detected by the RSO test.

Figure 5:
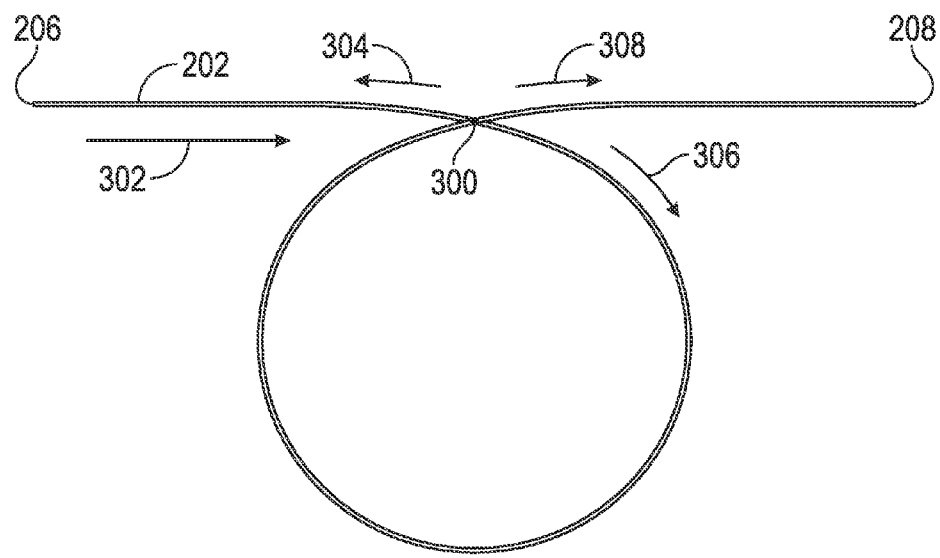
FIG. 5 is a simplified illustration of an inter-turn short circuit showing the basic principle of the RSO test.

FIG. 5 is a simplified illustration of an inter-turn short circuit showing the basic principle of the RSO test. The conductor 202 traces a loop, such as the turn 214 of the coil 210 shown in FIGS. 1 and 3. By design, there should be no contact between overlapping parts of the conductor 202. However, in the event of an inter-turn short circuit, a short circuit path is present between adjacent turns of the conductor 202, as shown at point 300. The RSO test applies a transmitted signal 302 into one end of the conductor 202 at the first terminal 206. Due to the impedance change associated with the short circuit at the point 300, a portion of the transmitted signal 302 is reflected back to the first terminal 206 as a reflected signal 304. An attenuated signal 306 continues on in the original direction through the conductor 202, although somewhat diminished and altered, and eventually reaches the other end of the conductor 202 at the second terminal 208. A short signal 308 jumps across the short circuit and also carries to the other end of the conductor 202 at the second terminal 208. In a typical RSO test, the transmitted signal 302 is applied in sequence at each end of the conductor 202, and for each transmission the attenuated signal 306 is measured at the opposite end, after which the difference between the attenuated signals 306 is evaluated.

As mentioned previously, in a typical RSO test, the output waveforms—usually the difference between the attenuated signals 306 produced by the two transmissions (one in each direction)—must be evaluated by a technician. The technician attempts to determine whether any inter-turn short circuits or ground faults are present in the winding—and if so, how many and where. Although the typical RSO test is good at detecting the presence of winding faults, determining the location of such faults is particularly difficult with a typical RSO test, as the analysis of the waveforms is generally only sufficient to identify, at best, which coil contains the fault.

The method disclosed herein improves on the fault location determination by measuring the amount of elapsed time from the transmitted signal to a recognizable spike in the reflected signal 304, and using the elapsed time to calculate the fault location. This calculation is described in the following discussion.

Figure 6:
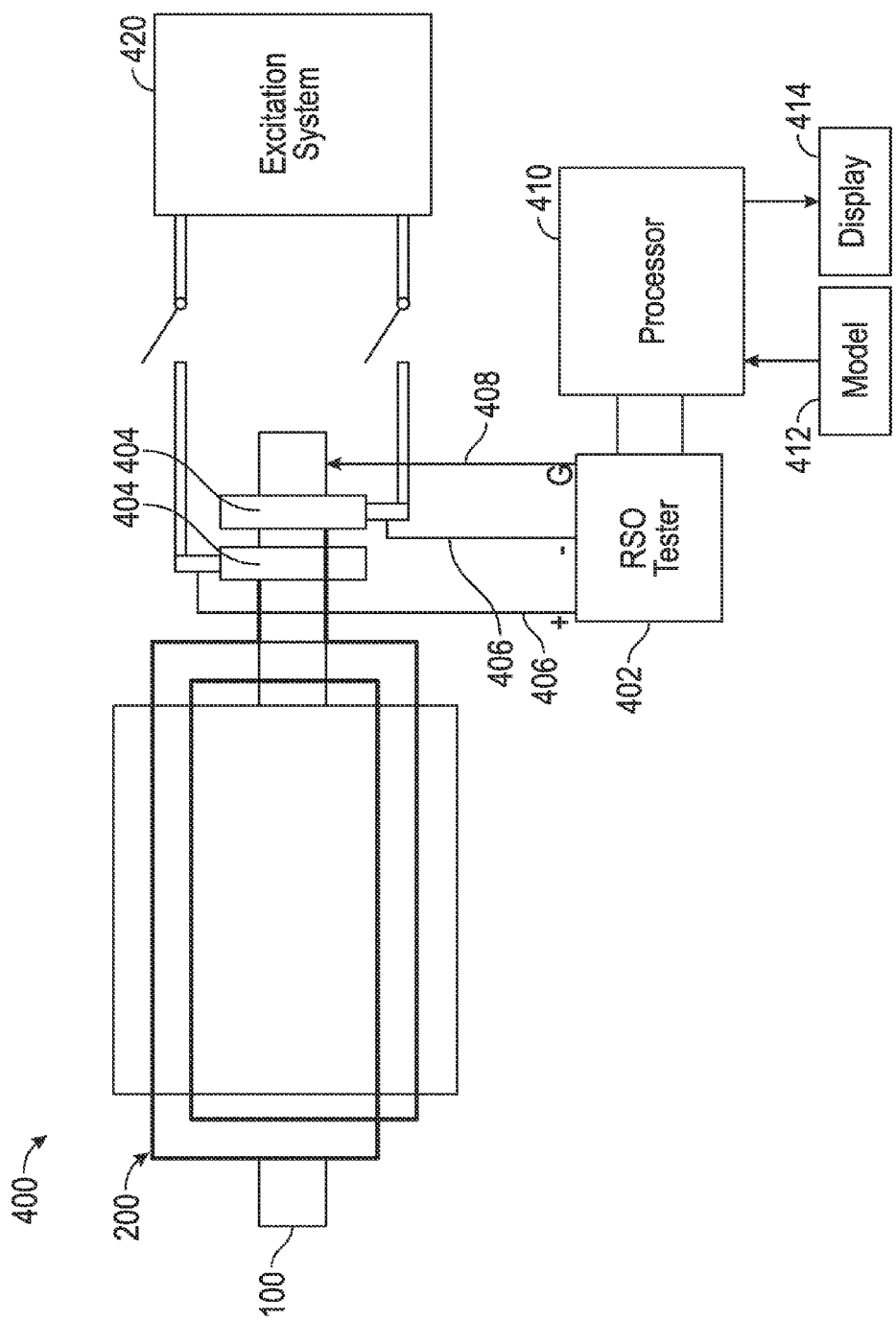
FIG. 6 is a block diagram of a system for locating inter-turn short circuits or ground faults in the winding of an electrical generator.

FIG. 6 is a block diagram of a system 400 for locating inter-turn short circuits or ground faults in the winding of an electrical generator. The rotor core 100 and the winding 200 are shown schematically in FIG. 6. An RSO tester 402 is connected to the winding 200 via slip rings 404 and test leads 406. A ground lead 408 also couples the RSO tester 402 to ground, such as the rotor core 100. A processor 410 is in communication with the RSO tester 402, so as to process output data from the RSO test and compute a fault location.

The processor 410 is a computing device including at least a microprocessor and a memory module, of any type commonly used in testing systems. The processor 410 may be a general purpose device which also performs other computing functions, or the processor 410 may be a custom design which is configured specifically for locating faults in generator rotors. In any case, the processor 410 is configured to perform the steps of the methods discussed herein. That is, the methods for rotor fault location identification are intended to be carried out on a computing device such as the processor 410, not in a person's head or using paper and pencil.

A model 412 of the winding 200 is provided as input to the processor 410. The model 412 is a mathematical model which defines the geometric shape of the winding 200, including the three-dimensional routing of the conductor 202 along its entire length—from its beginning at the first terminal 206, through all of the turns (212-218, etc.) of all of the coils (210, 220, 230, etc.) of all of the poles (250, 260, etc.), to its ending at the second terminal 208. The model 412 is capable of being analyzed or indexed so that, given a distance along the conductor 202 from the first terminal 206 (or, alternatively, from the second terminal 208), the model 412 can identify the location on the winding 200 which corresponds to the distance. For example, the model 412 could identify that a distance of 30 meters from the first terminal 206 corresponds to a particular location on the turn 218 of the coil 210 in the pole 250. The particular location on the turn 218 could be further identified as being in the middle of the end winding at the turbine end of the rotor. The model 412 is, of course, specific to the particular model of generator which is being analyzed via the RSO test.

A display 414 is also in communication with the processor 410, such that the display 414 can provide textual and/or graphical output displays to an operator. For example, the display 414 could provide a 3-D graphical depiction of the model 412 of the winding 200, including displaying on the model 412 the location of any inter-turn short circuits or ground faults which are identified during the RSO test. The display 414 could also display textual information—such as test status or tabular results data. In addition, the display 414 could serve as a user interface device to the operator, for configuring and running the RSO test.

It is to be noted, as mentioned previously, that the winding 200 is not energized during the RSO test. That is, an excitation system 420, which provides current flow through the winding 200 when the generator is in operation, is disconnected from the slip rings 404 during the RSO test, as shown in FIG. 6.

Figure 7:
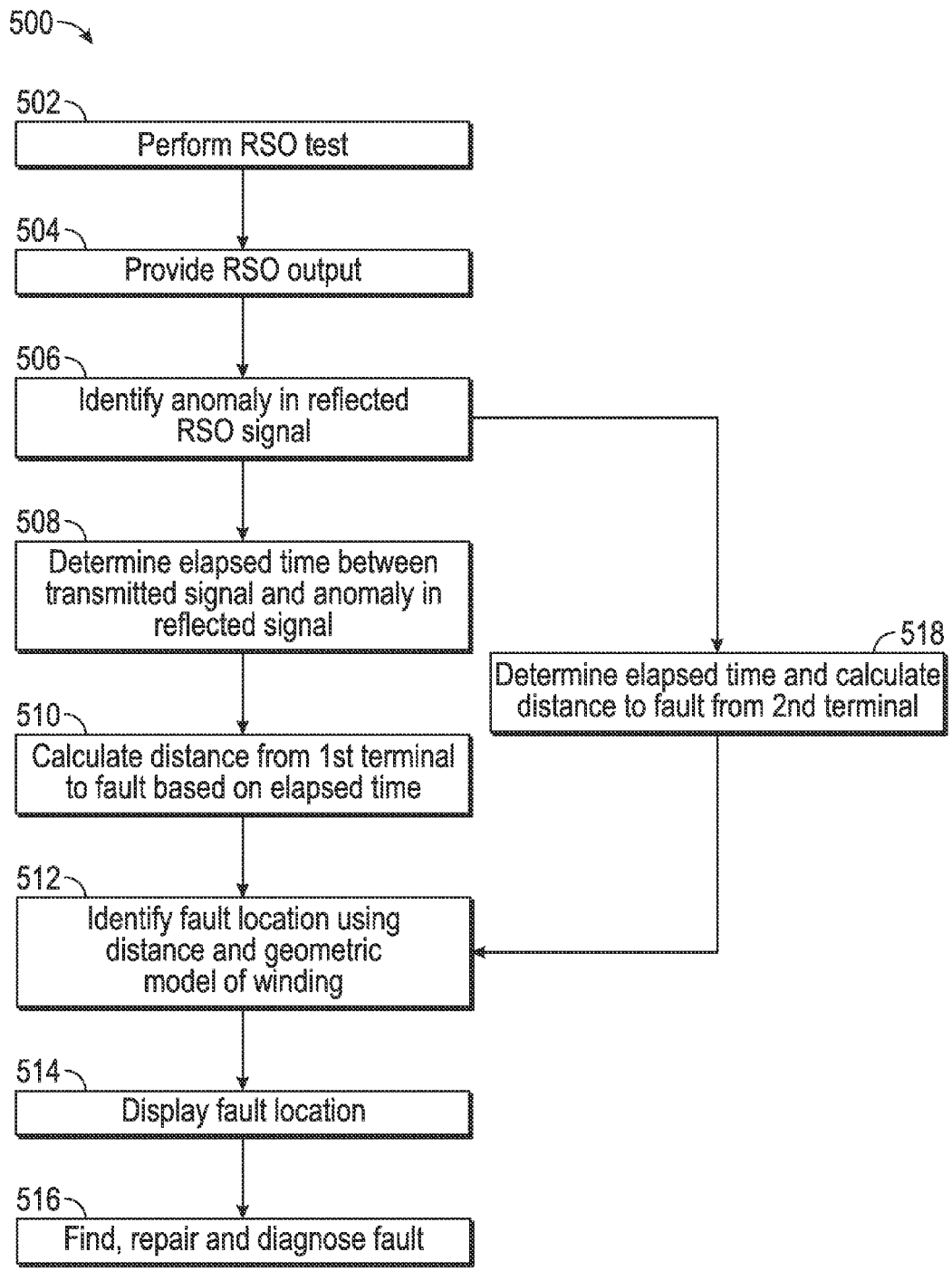
FIG. 7 is a flowchart diagram of a method for locating inter-turn short circuits or ground faults in the winding of an electrical generator.

FIG. 7 is a flowchart diagram 500 of a method for locating inter-turn short circuits or ground faults in the winding 200 of an electrical generator. At box 502, an RSO test is performed by the RSO tester 402, which is connected to the rotor winding 200 via the slip rings 404, as discussed above. At box 504, the RSO test output is provided and, at box 506, an anomaly is identified in the reflected signal 304 from the RSO output. The anomaly in the reflected signal 304 is caused by a fault in the winding 200, and the location of the fault is what is to be identified. Both inter-turn short circuits and ground faults cause anomalies (spikes, etc.) in the reflected signal 304 which are readily recognizable either by a person or a data analysis algorithm.

At box 508, an elapsed time between the transmitted signal 302 (transmitted from the first terminal 206) and the anomaly in the reflected signal 304 is determined. This determination is performed via a simple signal processing routine, as both the transmitted signal 302 and the reflected signal 304 are time-based waveforms. At box 510, a distance from the first terminal 206 to the fault is calculated based on the elapsed time. The calculation uses a Distance=Rate*Time formula, where Distance is the distance along the conductor 202 from the first terminal 206 to the fault, Rate is the speed of the RSO test signal along the conductor 202, and Time is one-half of the elapsed time (as the signal has to travel to the fault and back to the first terminal 206). The distance calculation at the box 510 is performed by the processor 410.

At box 512, the location of the fault in the winding 200 is identified using the distance from the box 510 and the model 412. As discussed above, the location of the fault identifies the coil containing the fault, the turn number within the coil, and the position within the turn. Along with the location of the fault, the type of fault (inter-turn short circuit or ground fault) could also be identified based on the nature of the anomaly in the reflected signal 304. Furthermore, multiple faults may be present in the winding 200, and the location and type of all of the faults can be identified using the method described herein.

At box 514, the location (and optionally, the type) of the fault or faults is displayed on the display 414. As discussed previously, this could include a textual or tabular display, and/or a graphical display. The textual or tabular display could be a listing of the location of each identified fault, where the listing includes a coil identifier, a turn identifier, and a position description, along with the fault type. The graphical display would preferably be a three-dimensional model of the winding 200 which can be manipulated (rotated, zoomed, panned, etc.) by the user/technician, including a visual indicator or any faults in their actual location on the winding 200. The graphical display could also include the type of fault.

At box 516, the technician finds, repairs, and diagnoses a cause of the fault, using the location information provided above. The repairs will be much faster and easier to complete with the accurate fault location information provided by the method and system described above. When a fault repair is performed by the technician, the RSO test could be re-run and the updated results displayed, so that the technician can get immediate feedback as to whether the fault was successfully repaired.

It is also possible to use transmitted and reflected signal data from the second terminal 208 to refine the location of faults in the winding 200. At box 518, elapsed times are determined and locations are calculated using the transmitted signal 302 and the reflected signal 304 from the second terminal 208, where fault anomalies are identified in the reflected signal 304 as discussed above. For a particular fault in the winding 200, a distance from the first terminal 206 and a distance from the second terminal 208 can be compared, and the actual location of the fault can be identified more accurately using the two measurements. The refined fault locations can be identified using the model 412 of the winding 200, and displayed on the display 414, as discussed previously.

Alternatively, the faults which are closer to the first terminal 206 (such as those in the coils of the first terminal 250 of FIG. 4) may be located based on the calculated distance from the first terminal 206, while the faults in the coils of the second terminal 260 may be located based on the calculated distance from the second terminal 208. This approach may give more accurate results for fault location, due to increased reflected signal strength and shorter distances.

Using the techniques described above, problems which are typically associated with finding inter-turn short circuits and ground faults in generator rotor windings can be minimized, due to the improved fault location information provided. The efficient discovery, repair and diagnosis of winding faults can reduce generator downtime and maintenance costs, and prolong the productive life of the generators.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for locating a fault in a rotor winding of an electrical generator, said method comprising:
   performing a Recurrent Surge Oscillograph (RSO) test, where the RSO test inputs a transmitted signal sequentially into each terminal of a winding conductor and measures output at each terminal;
   analyzing output data from the RSO test;
   identifying an anomaly in a reflected RSO signal;
   determining an elapsed time between the transmitted signal and the anomaly in the reflected RSO signal for a first terminal;
   calculating, using a microprocessor, a distance from the first terminal along the winding conductor to the fault based on the elapsed time, where calculating the distance includes multiplying one-half of the elapsed time by a rate of travel of the transmitted signal in the winding conductor; and
   using a mathematical model of the winding conductor to identify a location of the fault based on the distance from the first terminal.

2. The method of claim 1 wherein the fault has a type which is chosen from the group consisting of inter-turn short circuit and ground fault.

3. The method of claim 1 wherein the location of the fault includes identification of a coil, a turn within the coil and a position within the turn.

4. The method of claim 1 further comprising displaying the location of the fault on a three-dimensional graphical model of the winding conductor.

5. The method of claim 4 further comprising displaying a type of fault on the graphical model, where the type of fault is chosen from the group consisting of inter-turn short circuit and ground fault.

6. The method of claim 1 further comprising finding the fault in the rotor winding by a technician, repairing the fault and diagnosing a root cause of the fault.

7. The method of claim 1 further comprising determining a second elapsed time between the transmitted signal and the anomaly in the reflected RSO signal for the second terminal, calculating a distance from the second terminal along the winding conductor to the fault based on the second elapsed time, and using the mathematical model of the winding conductor to refine the location of the fault based on the distance from the second terminal.

8. The method of claim 1 wherein the mathematical model of the winding conductor includes a complete 3-dimensional routing model of the winding conductor as built in the rotor winding.

9. A method for locating one or more faults in a rotor winding of an electrical generator, said method comprising:
   providing output data from a Recurrent Surge Oscillograph (RSO) test, where the RSO test inputs a transmitted signal sequentially into each terminal of a winding conductor and measures output at each terminal;
   identifying one or more anomalies in a reflected RSO signal at each of a first terminal and a second terminal;
   determining, for each of the anomalies, at each of the first and second terminals, an elapsed time between the transmitted signal and the anomaly in the reflected RSO signal;
   calculating, using a microprocessor, a distance along the winding conductor from each of the first and second terminals to each of the faults based on the elapsed times for each of the anomalies;
   using a mathematical model of the winding conductor to identify a location of each of the faults based on the distances along the winding conductor from each of the first and second terminals; and
   displaying the location of each of the faults on a three-dimensional graphical model of the winding conductor, where the location includes identification of a coil, a turn within the coil and a position within the turn.

10. The method of claim 9 wherein calculating a distance includes multiplying one-half of the elapsed time by a rate of travel of the transmitted signal in the winding conductor.

11. The method of claim 9 wherein the mathematical model of the winding conductor includes a complete 3-dimensional routing model of the winding conductor as built in the rotor winding.

12. The method of claim 9 wherein each of the faults has a type which is chosen from the group consisting of inter-turn short circuit and ground fault.

13. A system for locating one or more faults in a rotor winding of an electrical generator, said system comprising:
   a Recurrent Surge Oscillograph (RSO) tester which sequentially inputs a transmitted signal into each of a first terminal and a second terminal of a winding conductor, and measures a reflected signal at both the first terminal and the second terminal;
   a processor configured to receive data from the RSO tester, identify an anomaly in the reflected signal, determine an elapsed time between the transmitted signal and the anomaly in the reflected signal for the first terminal, and calculate a distance from the first terminal along the winding conductor to the fault based on the elapsed time, where the distance is calculated as one-half of the elapsed time multiplied by a rate of travel of the transmitted signal in the winding conductor; and a mathematical model of the winding conductor which enables the processor to identify a location of the fault based on the distance from the first terminal.

14. The system of claim 13 wherein the fault has a type which is chosen from the group consisting of inter-turn short circuit and ground fault.

15. The system of claim 13 wherein the location of the fault includes identification of a coil, a turn within the coil and a position within the turn.

16. The system of claim 13 further comprising a display unit for displaying the location of the fault on a three-dimensional graphical model of the winding conductor.

17. The system of claim 13 wherein the mathematical model of the winding conductor includes a complete 3-dimensional routing model of the winding conductor as built in the rotor winding.

18. The system of claim 13 wherein the processor is also configured to determine a second elapsed time between the transmitted signal and the anomaly in the reflected RSO signal for the second terminal, calculate a distance from the second terminal along the winding conductor to the fault based on the second elapsed time, and use the mathematical model of the winding conductor to refine the location of the fault based on the distance from the second terminal.

* * * * *